United States Patent
Sobue et al.

(10) Patent No.: US 12,094,749 B2
(45) Date of Patent: Sep. 17, 2024

(54) RESIN COMPOSITION FOR TEMPORARY FIXING USE, RESIN FILM FOR TEMPORARY FIXING USE, SHEET FOR TEMPORARY FIXING USE, AND METHOD FOR MANUFACTURING SEMICONDUCTOR DEVICE

(71) Applicant: Resonac Corporation, Tokyo (JP)

(72) Inventors: Shogo Sobue, Tokyo (JP); Yasuyuki Ooyama, Tokyo (JP); Yushi Yamaguchi, Tokyo (JP)

( * ) Notice: Subject to any disclaimer, the term of this patent is extended or adjusted under 35 U.S.C. 154(b) by 604 days.

(21) Appl. No.: 17/414,954

(22) PCT Filed: Dec. 16, 2019

(86) PCT No.: PCT/JP2019/049245
§ 371 (c)(1),
(2) Date: Jun. 17, 2021

(87) PCT Pub. No.: WO2020/129917
PCT Pub. Date: Jun. 25, 2020

(65) Prior Publication Data
US 2022/0059388 A1     Feb. 24, 2022

(30) Foreign Application Priority Data

Dec. 20, 2018   (JP) ................................ 2018-238562

(51) Int. Cl.
*H01L 21/683* (2006.01)
*C09J 133/04* (2006.01)
(Continued)

(52) U.S. Cl.
CPC ........ *H01L 21/6835* (2013.01); *C09J 133/04* (2013.01); *C09J 161/04* (2013.01); *C09J 163/00* (2013.01); *H01L 2221/68386* (2013.01)

(58) Field of Classification Search
CPC ........ H01L 21/6835; H01L 2221/68386; C09J 133/04
See application file for complete search history.

(56) References Cited

U.S. PATENT DOCUMENTS

2013/0137218 A1*  5/2013  Morita ................. H01L 23/293
                                                  428/413

FOREIGN PATENT DOCUMENTS

CN     104412369      3/2015
CN     105849215      8/2016
(Continued)

OTHER PUBLICATIONS

International Search Report dated Jan. 28, 2020 for PCT/JP2019/049245.
(Continued)

*Primary Examiner* — Dale E Page
*Assistant Examiner* — Wilner Jean Baptiste
(74) *Attorney, Agent, or Firm* — SOEI PATENT & LAW FIRM

(57) ABSTRACT

A resin composition for temporary fixing, the resin composition containing (A) a thermoplastic resin, (B) a thermosetting resin, and (C) a silicone compound, the resin composition having a shear viscosity of 4000 Pa·s or less at 120° C. and a rate of change in the shear viscosity being within 30% as determined before and after the resin composition is left to stand for 7 days in an atmosphere of 25° C.

20 Claims, 7 Drawing Sheets

(51) Int. Cl.
*C09J 161/04* (2006.01)
*C09J 163/00* (2006.01)

(56) References Cited

FOREIGN PATENT DOCUMENTS

| | | |
|---|---|---|
| JP | 4565804 | 10/2010 |
| JP | 4936667 | 5/2012 |
| TW | 201615723 | 5/2016 |
| WO | 2016/035821 | 3/2016 |
| WO | 2017/191815 | 11/2017 |

OTHER PUBLICATIONS

International Preliminary Report on Patentability with Written Opinion dated Jul. 1, 2021 for PCT/JP2019/049245.

* cited by examiner (A)

(B)

(A)

(B)

(A)

(B)

(A)

(B)

(A)

(B)

(C)

(D)

(B)

(C)

(D)

(A)

(B)

RESIN COMPOSITION FOR TEMPORARY FIXING USE, RESIN FILM FOR TEMPORARY FIXING USE, SHEET FOR TEMPORARY FIXING USE, AND METHOD FOR MANUFACTURING SEMICONDUCTOR DEVICE

CROSS-REFERENCE TO RELATED APPLICATION

This application is a 35 U.S.C. § 371 national phase application of PCT/JP2019/049245, filed on Dec. 16, 2019, which claims priority to Japanese Patent Application No. 2018-238562, filed on Dec. 20, 2018.

TECHNICAL FIELD

The present invention relates to a resin composition for temporary fixing, a resin film for temporary fixing, a sheet for temporary fixing, and a method for manufacturing a semiconductor device.

BACKGROUND ART

A stacked MCP (Multi Chip Package) obtained by stacking semiconductor elements in multiple stages so as to have a high capacity has become widespread in association with the multi-functionalization of electronic devices such as a smartphone and a tablet PC. A film-shaped adhesive is widely used as an adhesive for die bonding in the mounting of the semiconductor element. However, since the processing speed of data is limited by the connection method of the semiconductor element using the current wire bond, the operation of the electronic devices tends to be slower. Furthermore, power saving is also being desired since there is a growing need to use the electronic devices for a long time without charging them while keeping the power consumption low. From such viewpoints, in recent years, electronic apparatuses having a new structure in which the semiconductor elements are connected to one another not by the wire bond but by a through electrode for the purpose of further increasing the speed and saving the power have also been developed.

High capacity is still desired although electronic apparatuses having a new structure have been developed in this manner, and the development of a technique that is able to stack semiconductor elements in more multiple stages has been promoted regardless of the package structure. However, stable thinning of the semiconductor element is essential in order to stack a greater number of semiconductor elements in a limited space.

For example, currently, in a grinding step of thinning a semiconductor wafer from a back surface side, it has become the mainstream to perform the grinding step in a state of the semiconductor wafer being supported by pasting a tape, so-called BG tape (back grinding tape) to the semiconductor element. However, in the semiconductor wafer to be subjected to the grinding step, a circuit is formed on the surface side, and when the semiconductor wafer is thinned by grinding, warpage is likely to occur due to the influence thereof. Since the BG tape is a deformable tape material, the BG tape cannot sufficiently support the thinned semiconductor wafer, and the semiconductor wafer is likely to warp.

From such a background, a process of thinning a semiconductor wafer by using, as a support, a silicon wafer or glass that is a harder material than the BG tape has been proposed. Further, a pressure sensitive adhesive interposing between a semiconductor wafer and a support (a silicon wafer or glass) so as to stick the semiconductor wafer and the support to each other has been proposed. It is required as important characteristics to such a pressure sensitive adhesive that the semiconductor element after being ground can be peeled off from the support without being damaged. Therefore, a peeling method is investigated in order to satisfy these characteristics. Examples of the peeling method include a method of dissolving a pressure sensitive adhesive by a solvent, a method of decreasing adhesion by heating, and a method of modifying or eliminating a pressure sensitive adhesive by irradiation of a laser beam (Patent Literatures 1 and 2).

CITATION LIST

Patent Literature

Patent Literature 1: Japanese Patent No. 4565804
Patent Literature 2: Japanese Patent No. 4936667

SUMMARY OF INVENTION

Technical Problem

However, it takes time to dissolve the pressure sensitive adhesive by the solvent, and thus the productivity is likely to decrease. Furthermore, in the method of decreasing adhesion by heating, it is concerned that the semiconductor element is affected by heating, and this method cannot be applied to the process application to form a through electrode or the like from the viewpoint of heat resistance. On the other hand, in the method of modifying or eliminating a pressure sensitive adhesive by irradiation of a laser beam, the introduction of expensive laser equipment is essential, and a considerable investment is essential for the application of such a process.

As mentioned above, in view of workability and necessity of expensive facility investment, there is a room for further improvement of the conventional pressure sensitive adhesive. In particular, such a pressure sensitive adhesive is mostly liquid one, and is used by being coated on a semiconductor wafer or a support by spin coating or the like and heated or irradiated with UV so as to be formed into a film. However, in such a case, the variation in thickness of the processed semiconductor wafer is likely to be caused in the individual semiconductor wafers by the variation in the pressure sensitive adhesive at the time of coating, and spin coating has a problem that it is necessary to discard the material scattered by the rotation at the time of coating.

Furthermore, the electronic component to be processed is not limited to those having high smoothness, but the case of using, as a target to be processed, wafers that are equipped with solder balls on the circuit surface and have surface unevenness of being more than 80 μm also tend to increase. In a case where a component having such large unevenness is a target to be processed, when a pressure sensitive adhesive is sufficiently embedded in the unevenness, it is difficult to peel off the pressure sensitive adhesive from the surface with unevenness. Furthermore, in a case where the bonding strength of the solder balls is insufficient, it is concerned that the solder balls are lost at the time of peeling off the pressure sensitive adhesive. Further, in the manufacturing process of an electronic component, for example, there is a process performed at higher than 200° C. such as a reflow step at the time of mounting solder balls or a formation step of a redistribution layer, it is necessary that the pressure sensitive adhesive securely holds the electronic component in these steps and can be simply peeled off after performing the process.

Further, in the case of using a material that is cured by irradiation of external energy of light, heat, or the like, storage stability in a clean room that is an usual environment of usage (UV cut, 25° C.) (hereinafter, referred to as "shelf life" in some cases) is also important. Since excellent step embeddability is required, when the shelf life is insufficient, insufficient embedding occurs and this greatly affects productivity, which is not preferred.

The present invention has been devised in view of the above-described circumstances, and an object thereof is to provide a resin composition for temporary fixing with which an electronic component can be favorably processed. Furthermore, another object of the present invention is to provide a resin film for temporary fixing and a sheet for temporary fixing which use the above-described resin composition for temporary fixing, and a method for manufacturing a semiconductor device.

Solution to Problem

A resin composition for temporary fixing according to the present invention is used for forming a temporary fixing material in a processing method of a semiconductor wafer, the method including a temporary fixing step of temporarily fixing a semiconductor wafer to a support via a temporary fixing material, a processing step of processing the semiconductor wafer temporarily fixed to the support, and a separation step of separating the processed semiconductor wafer from the temporary fixing material, the resin composition containing:
 (A) a thermoplastic resin;
 (B) a thermosetting resin; and
 (C) a silicone compound, in which
  a shear viscosity at 120° C. is 4000 Pa·s or less, and a rate of change in shear viscosity after the resin composition is left to stand for 7 days in an atmosphere of 25° C. is within 30%. The resin composition for temporary fixing of the present invention may further contain (D) a curing accelerator.

When the shear viscosity at 120° C. of the resin composition for temporary fixing is 4000 Pa·s or less (preferably 100 to 3000 Pa·s), even if there is unevenness on the surface of a semiconductor wafer that is a target to be processed, both step embeddability and peelability after processing can be made to be a sufficiently high level. Therefore, according to the present invention, the semiconductor wafer can be favorably processed, and thereby, an electronic component can be manufactured with high productivity.

A content of the thermosetting resin (B) in the resin composition for temporary fixing is, for example, 10 to 500 parts by mass with respect to 100 parts by mass of the thermoplastic resin (A), from the viewpoint of film formability. The thermosetting resin (B) may include at least one of an epoxy resin and a phenolic resin.

The thermoplastic resin (A) is, for example, a reactive group-containing (meth)acrylic copolymer containing a (meth)acrylic monomer having a reactive group as a copolymerization component. Specific examples of this reactive group-containing (meth)acrylic copolymer include an epoxy group-containing (meth)acrylic copolymer containing 1.0 to 10% by mass of a (meth)acrylic monomer having an epoxy group on the basis of the total amount of the copolymerization component.

From the viewpoint of compatibility with the resin component, as the silicone compound (C), for example, an organic group-modified silicone can be adopted.

The present invention provides a resin film for temporary fixing having a single-layer or multilayer structure, the resin film including at least one layer composed of the above-described resin composition for temporary fixing (hereinafter, referred to as "resin layer for temporary fixing" depending on circumstances). When the resin composition for temporary fixing is formed in a film shape having a sufficiently uniform thickness in advance, the variation in thickness, which may occur in the processed semiconductor wafer, can be sufficiently suppressed, and the semiconductor wafer can be efficiently processed. The resin film for temporary fixing of the present invention may have two resin layers for temporary fixing. When the resin film for temporary fixing has a two-layer configuration, there is an advantage that both the step embeddability and the peelability after processing can be obtained with a higher level. In the resin film for temporary fixing, one resin layer for temporary fixing and another resin layer for temporary fixing may be in direct contact with each other. In this case, two layers may be integrally formed so as to be a single-layer structure, and a two-layer structure may be maintained while an interface exists between two layers. These temporary fixing resin films are, as mentioned above, interposed between a support and a semiconductor wafer and can be used for temporary fixing the semiconductor wafer to the support.

The present invention provides a sheet for temporary fixing including the above-described temporary fixing resin film and a support film provided on at least one surface of the temporary fixing resin film. It is preferable that a surface, which is in contact with the temporary fixing resin film, of the support film has releasability.

The present invention provides a method for manufacturing a semiconductor device using the above-described resin composition for temporary fixing. Specifically, the method for manufacturing a semiconductor device according to the present invention includes a temporary fixing step of temporarily fixing a semiconductor wafer to a support via a temporary fixing material composed of the resin composition for temporary fixing, a processing step of processing the semiconductor wafer temporarily fixed to the support, and a separation step of separating the processed semiconductor wafer from the temporary fixing material.

Advantageous Effects of Invention

According to the present invention, it is possible to provide a resin composition for temporary fixing with which an electronic component can be favorably processed. Furthermore, according to the present invention, it is possible to provide a resin film for temporary fixing and a sheet for temporary fixing which use the above-described resin composition for temporary fixing, and a method for manufacturing a semiconductor device.

DESCRIPTION OF EMBODIMENTS

Figure 1:
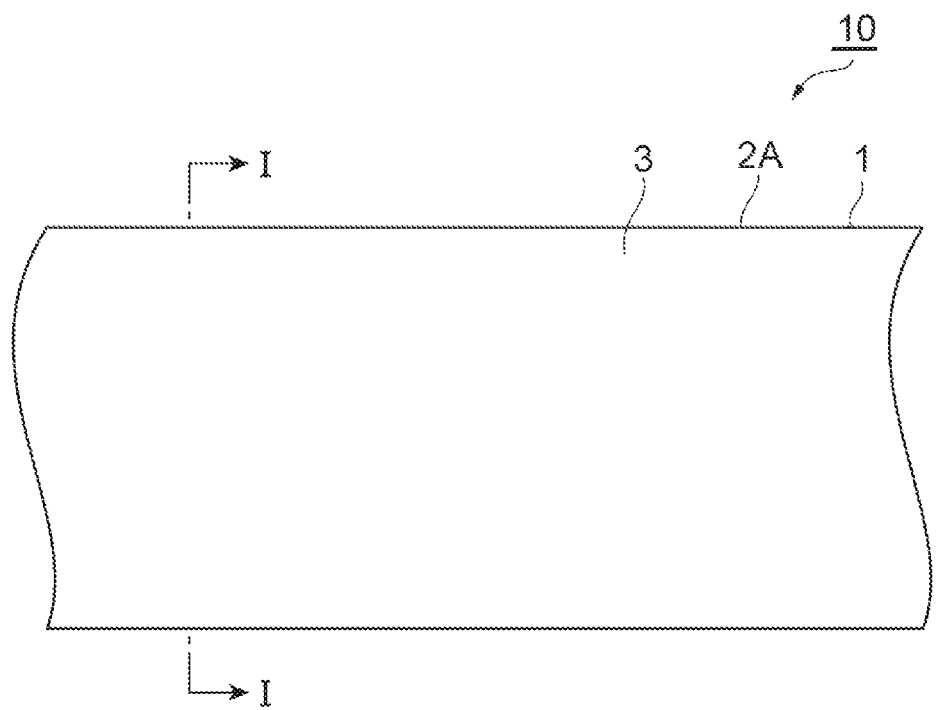
FIG. 1(A) is a top view illustrating an embodiment of a sheet for temporary fixing.
FIG. 1(B) is a schematic cross-sectional view taken along line I-I in FIG. 1(A).
Figure 1:
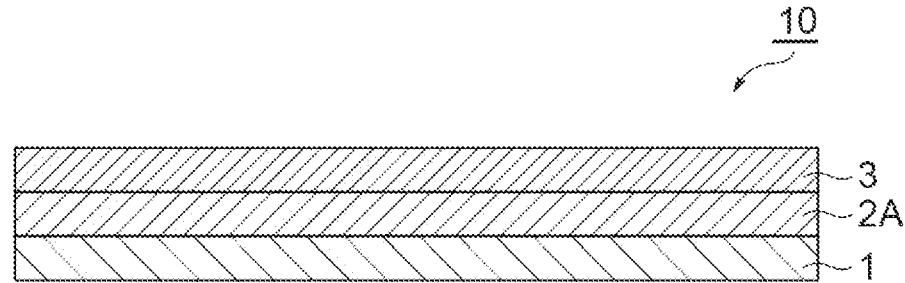

Hereinafter, embodiments of the present invention will be specifically described with reference to the drawings. Note that, in the drawings, the same or similar portions are denoted with the same reference signs and repeated description is omitted. Furthermore, dimension ratios in the drawings are not limited to illustrated ratios. However, the present invention is not limited to the following embodiments. In the present specification, "(meth)acryl" means acryl or methacryl.

[Resin Composition for Temporary Fixing]

A temporary fixing material resin composition according to the present embodiment contains (A) a thermoplastic resin, (B) a thermosetting resin, and (C) a silicone compound, in which a shear viscosity at 120° C. is 4000 Pa·s or less, and a rate of change in shear viscosity after the resin composition is left to stand for 7 days in an atmosphere of 25° C. is within 30%. By using this temporary fixing material resin composition as a temporary fixing material (resin layer for temporary fixing), the semiconductor wafer can be favorably processed, and thereby, an electronic component can be manufactured with high productivity.

The shear viscosity at 120° C. of the resin composition for temporary fixing is, as mentioned above, 4000 Pa·s or less and preferably in a range of 100 to 3000 Pa·s, and may be 300 to 2500 Pa·s or 500 to 2000 Pa·s. When the shear viscosity at 120° C. of the resin composition for temporary fixing is 4000 Pa·s or less, excellent step embeddability can be achieved even if there is unevenness on the surface of a semiconductor wafer that is a target to be processed, and excellent peelability from the surface with unevenness can also be achieved after the layer composed of the resin composition for temporary fixing embeds the unevenness. When the shear viscosity at 120° C. of the resin composition for temporary fixing is 100 Pa·s or more, the film state at the time of heating after processing the semiconductor wafer can be maintained.

The rate of change in shear viscosity after the temporary fixing material resin composition is left to stand for 7 days in an atmosphere of 25° C. is, as mentioned above, within 30% and preferably in a range of 0 to 25%, and may be 0 to 20% or 0 to 15%. When this change rate is within 30%, the temporary fixing material resin composition has excellent storage stability, and an electronic component can be manufactured with high productivity. Note that, the rate of change in shear viscosity is a value calculated by the following equation.

Rate (%) of change in shear viscosity=[(Shear viscosity at 120° C. after the resin composition is left to stand for 7 days in an atmosphere of 25° C.)−(Shear viscosity at 120° C. before the resin composition is left to stand for 7 days in an atmosphere of 25° C.)]/(Shear viscosity at 120° C. before the resin composition is left to stand for 7 days in an atmosphere of 25° C.)×100

Note that, the "shear viscosity at 120° C. before the resin composition is left to stand for 7 days in an atmosphere of 25° C." is preferably measured using, as a sample, a temporary fixing material resin composition not exposed to the outside environment whenever possible, and for example, it is preferable to measure a sample within 5 hours after preparation or after opening. Furthermore, the relative humidity of the environment in which the resin composition is left to stand for 7 days may be about 55%.

The shear viscosity of the temporary fixing material resin composition before and after being left to stand for 7 days means a measurement value in the case of measuring the shear viscosity while applying 5% strain to the resin film for temporary fixing and increasing the temperature at a temperature increase rate of 20° C./min by using ARES (manufactured by Rheometric Scientific Inc.).

The storage elastic modulus at 25° C. of the temporary fixing material resin composition after curing is preferably 20 MPa or more and more preferably 50 MPa or more. When this storage elastic modulus is 20 MPa or more, there is a tendency that the electronic component and the support can be sufficiently fixed at the time of thinning the electronic component. The upper limit value of this storage elastic modulus is, for example, 6000 MPa or less. The storage elastic modulus of the temporary fixing material resin composition after curing means a measurement value in the case of measuring the storage elastic modulus while increasing the temperature at a temperature increase rate of 3° C./min by using a dynamic viscoelasticity measuring apparatus (manufactured by UBM).

<(A) Thermoplastic Resin>

As the thermoplastic resin (A), any thermoplastic resin can be used without particular limitation as long as it is a resin having thermal plasticity before laminating at least the film to the electronic component or the support. The thermoplastic resin may be a resin forming a cross-linked structure by heating or the like.

A polymer having a cross-linkable functional group can be used as the thermoplastic resin (A). Examples of the polymer having a cross-linkable functional group include a thermoplastic polyimide resin, a (meth)acrylic copolymer having a cross-linkable functional group, a urethane resin, a polyphenylene ether resin, a polyetherimide resin, a phenoxy resin, and a modified polyphenylene ether resin. Among these, a (meth)acrylic copolymer having a cross-linkable functional group is preferred. The above-described resin may be used alone and may be used in combination of two or more kinds thereof.

As the (meth)acrylic copolymer having a cross-linkable functional group, those obtained by a polymerization method such as pearl polymerization or solution polymerization may be used or commercially available products may be used. The polymer having a cross-linkable functional group may have a cross-linkable functional group in the polymer chain or at the polymer chain terminal. Specific examples of the cross-linkable functional group include an epoxy group, an alcoholic hydroxyl group, a phenolic hydroxyl group, and a carboxyl group. Among these cross-linkable functional group, a carboxyl group is preferred. The carboxyl group can be introduced into the polymer chain by using acrylic acid.

The glass transition temperature (hereinafter, also referred to as "Tg" in some cases) of the thermoplastic resin (A) is preferably −50° C. to 50° C. and more preferably −40° C. to 20° C. When the Tg is in such a range, it is possible to obtain more adequate fluidity while suppressing the deterioration of handling property caused by an excessive increase in tackiness, and it is possible to further lower the elastic modulus after curing, so that an excessive increase in the peeling strength can be further suppressed.

The Tg is a midpoint glass transition temperature value obtained when the thermoplastic resin is measured using differential scanning calorimetry (DSC, for example, "Thermo Plus 2" manufactured by Rigaku Corporation). Specifically, the above-described Tg is a midpoint glass transition temperature calculated by the method according to JIS K 7121:1987 by measuring a change in calorific value under the conditions of a temperature increase rate of 10° C./min and a measurement temperature of −80° C. to 80° C.

The weight average molecular weight of the thermoplastic resin (A) is not particularly limited, and is preferably 100000 to 1200000 and more preferably 200000 to 1000000. When the weight average molecular weight of the thermoplastic resin is in such a range, film formability and fluidity are easily secured. The weight average molecular weight is a value in terms of polystyrene using a calibration curve of standard polystyrene by gel permeation chromatography (GPC).

<(B) Thermosetting Resin>

Examples of the thermosetting resin (B) include an epoxy resin, an acrylic resin, a silicone resin, a phenolic resin, a thermosetting polyimide resin, a polyurethane resin, a melamine resin, and a urea resin, and these may be used alone and may be used in combination of two or more kinds thereof.

The epoxy resin is not particularly limited as long as it is cured and has a heat-resistant effect. As the epoxy resin, a bifunctional epoxy resin such as bisphenol A type epoxy, a novolak type epoxy resin such as a phenol novolak type epoxy resin or a cresol novolak type epoxy resin, and the like can be used. Furthermore, as the epoxy resin, a generally known resin such as a polyfunctional epoxy resin, a glycidyl amine type epoxy resin, a heterocyclic ring-containing epoxy resin, or an alicyclic epoxy resin can be used.

Examples of the bisphenol A type epoxy resin include jER (registered trademark) series (Epikote 807, Epikote 815, Epikote 825, Epikote 827, Epikote 828, Epikote 834, Epikote 1001, Epikote 1004, Epikote 1007, and Epikote 1009, "Epikote" is the registered trademark) manufactured by Mitsubishi Chemical Corporation, DER-330, DER-301, and DER-361 manufactured by The Dow Chemical Company, and YD8125 and YDF8170 manufactured by Nippon Steel & Sumikin Chemical Co., Ltd. Examples of the phenol novolak type epoxy resin include Epikote 152 and Epikote 154 manufactured by Japan Epoxy Resins Co., Ltd., EPPN-201 manufactured by Nippon Kayaku Co., Ltd., and DEN-438 manufactured by The Dow Chemical Company. Examples of an o-cresol novolak type epoxy resin include EOCN-102S, EOCN-103S, EOCN-104S, EOCN-1012, EOCN-1025, and EOCN-1027 manufactured by Nippon Kayaku Co., Ltd. ("EOCN" is the registered trademark) and YDCN701, YDCN702, YDCN703, and YDCN704 manufactured by Nippon Steel & Sumikin Chemical Co., Ltd.

Examples of the polyfunctional epoxy resin include Epon 1031S manufactured by Japan Epoxy Resins Co., Ltd., ARALDITE 0163 manufactured by Huntsman Japan, and DENACOL EX-611, EX-614, EX-614B, EX-622, EX-512, EX-521, EX-421, EX-411, and EX-321 manufactured by Nagase ChemteX Corporation ("ARALDITE" and "DENACOL" are the registered trademarks). Examples of the amine type epoxy resin include Epikote 604 manufactured by Japan Epoxy Resins Co., Ltd., YH-434 manufactured by Nippon Steel & Sumikin Chemical Co., Ltd., TETRAD-X and TETRAD-C manufactured by MITSUBISHI GAS CHEMICAL COMPANY, INC. ("TETRAD" is the registered trademark), and ELM-120 manufactured by SUMITOMO CHEMICAL COMPANY, LIMITED. Examples of the heterocyclic ring-containing epoxy resin include ARALDITE PT810 manufactured by Ciba Specialty Chemicals Inc., and ERL4234, ERL4299, ERL4221, and ERL4206 manufactured by UCC. These epoxy resins may be used alone and may be used in combination of two or more kinds thereof.

In the case of using an epoxy resin as a thermosetting resin, it is preferably to use an epoxy resin curing agent in combination therewith.

As the epoxy resin curing agent (B), a known curing agent which is generally used can be used. Hereinafter, the epoxy resin curing agent and the curing agent are collectively referred to as the "thermosetting component". Examples of the epoxy resin curing agent include amines, polyamides, acid anhydrides, polysulfides, boron trifluoride, bisphenols having two or more phenolic hydroxyl groups in one molecule such as bisphenol A, bisphenol F, and bisphenol S, and phenolic resins such as a phenol novolak resin, a bisphenol A novolak resin, and a cresol novolak resin. Particularly, from the viewpoint of having excellent electric corrosion resistance upon absorption of moisture, the epoxy resin curing agent is preferably phenolic resins such as a phenol novolak resin, a bisphenol A novolak resin, and a cresol novolak resin.

Preferred examples of the phenolic resin as the above-described epoxy resin curing agent include PHENOLITE LF2882, PHENOLITE LF2822, PHENOLITE TD-2090, PHENOLITE TD-2149, PHENOLITE VH-4150, and PHENOLITE VH4170 (trade names) manufactured by DIC Corporation, H-1 (trade name) manufactured by Meiwa Plastic Industries, Ltd., jERCURE MP402FPY, Epicure YL6065, and Epicure YLH129B65 (trade names) manufactured by Japan Epoxy Resins Co., Ltd., and MILEX XL, MILEX XLC, MILEX RN, MILEX RS, and MILEX VR (trade names) manufactured by Mitsui Chemicals, Inc. ("PHENOLITE", "Epicure", and "MILEX" are the registered trademarks).

The content of the thermosetting resin (B) in the resin composition for temporary fixing is preferably 10 to 500 parts by mass and more preferably 20 to 300 parts by mass with respect to 100 parts by mass of the thermoplastic resin (A). When the mixing amount of the curable component is within the above-described range, the resin film for temporary fixing can have sufficient low-temperature pasting property, heat resistance, curability, and peelability. When the content of the thermosetting resin (B) is 10 parts by mass or more, there are tendencies that adhesive property and heat resistance are improved, retainability at the time of back grinding is also improved, and the wafer is less likely cracked. On the other hand, when the content of the thermosetting resin (B) is 500 parts by mass or less, there are tendencies that the viscosity before curing is less likely to excessively decrease, curing can be performed in a relatively short time, and both the retainability of the electronic component to the support and the peelability from the support can be achieved.

<(C) Silicone Compound>

As the silicone compound (C), any compound can be used without particular limitation as long as it has a polysiloxane structure. Examples thereof include a silicone-modified resin, straight silicone oil, nonreactive modified silicone oil, and reactive modified silicone oil. The silicone compound can be used alone or in combination of two or more kinds thereof.

When the resin composition for temporary fixing contains the silicone compound, a film-shaped temporary fixing material formed from the resin composition for temporary fixing can be easily peeled off without using a solvent even at a low temperature of 100° C. or lower when the temporary fixing material is peeled off from the semiconductor chip, a sealing body, and the support.

In a case where the silicone compound used in the present embodiment is a silicone-modified resin, the silicone-modified resin is not particularly limited as long as it is a resin modified with silicone. As the silicone-modified resin, a silicone-modified alkyd resin is preferred. By containing the silicone-modified alkyd resin, the resin film for temporary fixing can be further easily peeled off without using a solvent when the resin film for temporary fixing is peeled off from the electronic component.

In a case where the silicone compound used in the present embodiment is modified silicone oil, polyether-modified silicone, alkyl-modified silicone, or epoxy-modified silicone is preferred.

As the silicone as mentioned above, any silicone can be used without particular limitation as long as it is compatible with a high molecular weight material. Examples of the silicone include SH3773M, L-7001, SH-550, and SH-710 manufactured by Dow Corning Toray Co., Ltd., X-22-163, KF-105, X-22-163B, and X-22-163C manufactured by Shin-Etsu Chemical Co., Ltd., and BYK-UV3500 manufactured by BYK.

The content of the silicone compound (C) in the resin composition for temporary fixing is preferably 0 to 100 parts by mass and more preferably 0.01 to 80 parts by mass with respect to 100 parts by mass of the thermoplastic resin (A). When the content of the silicone compound (C) is in the above-described range, both adhesiveness at the time of processing the electronic component and peelability after processing can be achieved at a higher level.

<(D) Curing Accelerator>

The resin composition for temporary fixing may contain a curing accelerator (D). Examples of the curing accelerator (D) include imidazoles, dicyandiamide derivatives, dicarboxylic acid dihydrazides, triphenylphosphine, tetraphenylphosphonium tetraphenylborate, 2-ethyl-4-methylimidazole-tetraphenylborate, and 1,8-diazabicyclo[5,4,0] undecene-7-tetraphenylborate. These may be used alone and may be used in combination of two or more kinds thereof.

In a case where the thermoplastic resin (A) contains a (meth)acrylic copolymer having an epoxy group, it is preferable to contain a curing accelerator promoting the curing of the epoxy group contained in this acrylic copolymer.

The content of the curing accelerator (D) in the resin composition for temporary fixing is preferably 0.01 to 5.0 parts by mass with respect to 100 parts by mass of the thermoplastic resin (A). When the content of the curing accelerator (C) is 0.01 parts by mass or more with respect to 100 parts by mass of the thermoplastic resin (A), the resin composition for temporary fixing can be sufficiently cured in the heat history in the manufacturing process of the semiconductor element, and thus the electronic component and the support can be more securely fixed to each other. When the content of the curing accelerator (D) is 5.0 parts by mass or less with respect to 100 parts by mass of the thermoplastic resin (A), there are tendencies that the melt viscosity of the resin film for temporary fixing is less likely to increase by heating in the manufacturing process and storage stability of the film becomes more favorable.

<Other Components>

The resin composition for temporary fixing may contain a filler (an inorganic filler and/or an organic filler), a silane coupling agent, and the like as components other than the above-described components.

Examples of the inorganic filler include metal fillers such as silver powder, gold powder, and copper powder; and non-metallic inorganic fillers such as silica, alumina, boron nitride, titania, glass, iron oxide, and ceramics. The inorganic filler can be selected according to desired functions. The metal filler can be added for providing thixotropy property to a film. The non-metallic inorganic filler can be added for providing low thermal expansion property and low hygroscopic property to the film. The inorganic filler may be used alone and may be used in combination of two or more kinds thereof.

The inorganic filler preferably has an organic group on a surface. When the surface of the inorganic filler is modified with the organic group, dispersibility into an organic solvent at the time of preparing a resin composition for forming the film and the adhesiveness and heat resistance of the film are easily improved.

The inorganic filler having an organic group on a surface can be obtained, for example, by mixing a silane coupling agent represented by the following General Formula (B-1) and an inorganic filler and stirring them at a temperature of 30° C. or higher. The fact that the surface of the inorganic filler is modified with the organic group can be confirmed by UV (ultraviolet rays) measurement, IR (infrared rays) measurement, XPS (X-ray photoelectron spectroscopy) measurement, and the like.

[Chemical Formula 1]

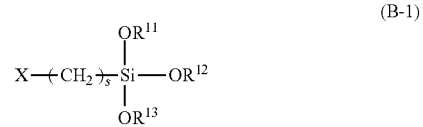

(B-1)

In Formula (B-1), "X" represents an organic group selected from the group consisting of a phenyl group, a glycidoxy group, an acryloyl group, a methacryloyl group, a mercapto group, an amino group, a vinyl group, an isocyanate group, and a methacryloxy group, "s" represents an integer of 0 or 1 to 10, and $R^{11}$, $R^{12}$, and $R^{13}$ each independently represent an alkyl group having 1 to 10 carbon atoms. Examples of the alkyl group having 1 to 10 carbon atoms include a methyl group, an ethyl group, a propyl group, a butyl group, a pentyl group, a hexyl group, a heptyl group, an octyl group, a nonyl group, a decyl group, an isopropyl group, and an isobutyl group. The alkyl group having 1 to 10 carbon atoms is preferably a methyl group, an ethyl group, and a pentyl group from the viewpoint of ease of availability. From the viewpoint of heat resistance, "X" is preferably an amino group, a glycidoxy group, a mercapto group, and an isocyanate group and more preferably a glycidoxy group and a mercapto group. "s" in Formula (B-1) is preferably 0 to 5 and more preferably 0 to 4 from the viewpoints of suppressing film fluidity at high temperatures and improving heat resistance.

Preferred examples of the silane coupling agent include trimethoxyphenylsilane, dimethyldimethoxyphenylsilane, triethoxyphenylsilane, dimethoxymethylphenylsilane, vinyltriethoxysilane, vinyltrimethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-aminopropyltrimethoxysilane, 3-glycidoxypropyltrimethoxysilane, 3-glycidoxypropylmethyldimethoxysilane, 2-(3,4-epoxycyclohexyl)ethyltrimethoxysilane, 3-isocyanatopropyltriethoxysilane, 3-methacryloxypropyltrimethoxysilane, 3-mercaptopropyltrimethoxysilane, 3-ureidopropyltriethoxysilane, N-(1,3-dimethylbutylidene)-3-(triethoxysilyl)-1-propanamine, N,N'-bis(3-(trimethoxysilyl)propyl)ethylenediamine, polyoxyethylenepropyltrialkoxysilane, and polyethoxydimethylsiloxane. Among these, 3-aminopropyltriethoxysilane, 3-glycidoxypropyltrimethoxysilane, 3-isocyanatopropyltriethoxysilane, and 3-mercaptopropyltrimethoxysilane are preferred, and trimethoxyphenylsilane, 3-glycidoxypropyltrimethoxysilane, and 3-mercaptopropyltrimethoxysilane are more preferred. The silane coupling agent may be used alone and may be used in combination of two or more kinds thereof.

The used amount of the above-described coupling agent is preferably 0.01 to 50 parts by mass and more preferably 0.05 to 20 parts by mass with respect to 100 parts by mass of the inorganic filler from the viewpoint of attaining a balance between the effect of improving heat resistance and storage stability and is further preferably 0.5 to 10 parts by mass from the viewpoint of improving heat resistance.

The content of the inorganic filler is preferably 300 parts by mass or less, more preferably 200 parts by mass or less, and further preferably 100 parts by mass or less with respect to 100 parts by mass of the thermoplastic resin (A), from the viewpoints of improving the handleability of the resin film for temporary fixing in the B-stage state and improving the low thermal expansion properties. The lower limit of the content of the inorganic filler is not particularly limited, but is preferably 5 parts by mass or more with respect to 100 parts by mass of the thermoplastic resin. When the content of the inorganic filler is in the above-described range, there is a tendency that a desired function can be provided while sufficiently securing adhesiveness.

Examples of the organic filler include carbon, a rubber-based filler, silicone-based fine particles, polyamide fine particles, and polyimide fine particles. The content of the organic filler is preferably 300 parts by mass or less, more preferably 200 parts by mass or less, and further preferably 100 parts by mass or less with respect to 100 parts by mass of the thermoplastic resin (A). The lower limit of the content of the organic filler is not particularly limited, but is preferably 5 parts by mass or more with respect to 100 parts by mass of the thermoplastic resin.

[Resin Film for Temporary Fixing and Sheet for Temporary Fixing Including Same]

In a case where the resin composition for temporary fixing according to present embodiment is the resin film for temporary fixing, since the pressure sensitive adhesive has a film shape, the control of the film thickness is more facilitated, and the variation in thickness in the individual electronic components can be reduced. Furthermore, the resin film for temporary fixing according to the present embodiment can be bonded onto the electronic component or the support by a simple method such as lamination and is also excellent in workability.

The thickness of the resin film for temporary fixing is not particularly limited, and is preferably 10 to 350 μm from the viewpoint of sufficiently fixing the electronic component to the support for transportation. When the thickness is 10 μm or more, since the variation in thickness at the time of coating is decreased and the thickness is sufficient, the strength of the film or the cured product of the film becomes favorable, and the electronic component and the support for transportation can be more sufficiently fixed to each other. When the thickness is 350 μm or less, the variation in thickness of the resin film for temporary fixing is less likely to occur, the amount of the remaining solvent in the film can be easily decreased by sufficient drying, and thus it is possible to further reduce foam formation at the time of heating the cured product of the film.

FIG. 1(A) is a top view illustrating an embodiment of a sheet for temporary fixing, and FIG. 1(B) is a schematic cross-sectional view taken along line I-I in FIG. 1(A). A sheet for temporary fixing 10 illustrated in these drawings includes a support film 1, a resin film for temporary fixing 2A composed of a resin composition for temporary fixing, and a protective film 3 in this order.

The support film 1 is not particularly limited, and examples thereof include polyethylene terephthalate, polybutylene telephthalate, polyethylene naphthalate, polyethylene, polypropylene, polyamide, and polyimide. The support film 1 is preferably polyethylene terephthalate, polybutylene telephthalate, polyethylene naphthalate, polypropylene, polyamide, or polyimide, from the viewpoint of having excellent flexibility and excellent toughness. Furthermore, from the viewpoint of improving peelability with the resin film (resin layer), it is preferable to use a film subjected to a release treatment by a silicone-based compound, a fluorine-based compound, and the like as the support film.

The thickness of the support film 1 may be appropriately changed according to target flexibility, and is preferably 3 to 350 μm. When the thickness is 3 μm or more, the film strength is sufficient, and when the thickness is 350 μm or less, sufficient flexibility tends to be obtained. From such viewpoints, the thickness of the support film 1 is more preferably 5 to 200 μm and further preferably 7 to 150 μm.

The protective film 3 is not particularly limited, and examples thereof include polyethylene terephthalate, polybutylene telephthalate, polyethylene naphthalate, polyethylene, and polypropylene. The protective film 3 is preferably polyethylene terephthalate, polyethylene, or polypropylene, from the viewpoints of flexibility and toughness. Furthermore, from the viewpoint of improving peelability with the resin film for temporary fixing (resin layer), it is preferable to use a film subjected to a release treatment by a silicone-based compound, a fluorine-based compound, and the like as the protective film 3.

The thickness of the protective film 3 can be appropriately set according to target flexibility, and is, for example, preferably 10 to 350 μm. When the thickness is 10 μm or more, the film strength becomes more favorable, and when the thickness is 350 μm or less, more favorable flexibility is obtained. From such viewpoints, the thickness of the protective film 3 is more preferably 15 to 200 μm and further preferably 20 to 150 μm.

The resin film for temporary fixing 2A can be formed by a method of mixing and kneading the aforementioned components in an organic solvent to prepare a varnish, coating the prepared varnish on the support film 1, and then drying the varnish. The organic solvent is not particularly limited, but can be determined in consideration of volatility or the like at the time of film formation from boiling points.

Specifically, solvents having a relatively low boiling point such as methanol, ethanol, 2-methoxyethanol, 2-ethoxyethanol, 2-butoxyethanol, methyl ethyl ketone, acetone, methyl isobutyl ketone, toluene, and xylene are preferred from the viewpoint that curing of a film hardly proceeds at the time of film formation. Further, for the purpose of improvement in film forming properties, or the like, for example, solvents having a relatively high boiling point such as dimethylacetamide, dimethylformamide, N-methylpyrrolidone, and cyclohexanone are preferably used. These solvents may be used alone and may be used in combination of two or more kinds thereof. The solid content concentration in the varnish is preferably 10 to 80% by mass.

The mixing and kneading can be performed by appropriately combining general dispersers such as stirrers, Raikai machines, three-roll mills, and ball mills. The drying by heating described above can be performed by typically performing heating at 60° C. to 200° C. for 0.1 to 90 minutes although the condition is not particularly limited as long as it is a condition that the used solvent vaporizes sufficiently. The resin film for temporary fixing 2A is formed on the support film 1 by heating and drying. Thereafter, the protective film 3 is bonded to cover the resin film for temporary fixing 2A, and thereby the sheet for temporary fixing 10 is obtained.

The sheet for temporary fixing 10 obtained in this way can be easily stored, for example, by being wound in a roll shape.

Furthermore, the roll-shaped sheet for temporary fixing 10 can also be stored in a state of being cut into a suitable size.

Figure 2:
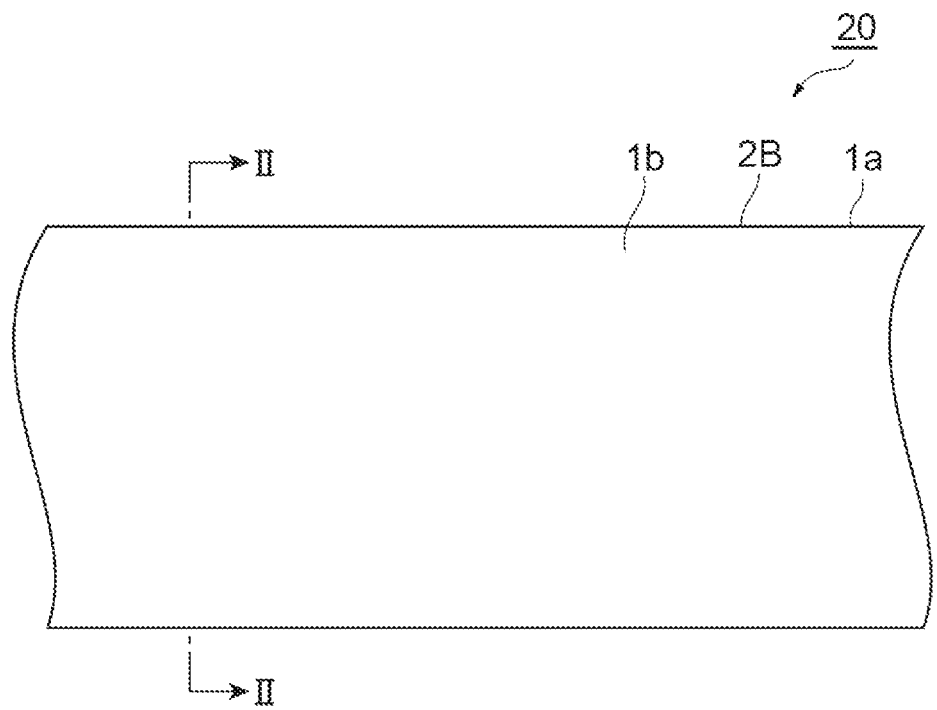
FIG. 2(A) is a top view illustrating an embodiment of a sheet for temporary fixing having two resin layers for temporary fixing.
FIG. 2(B) is a schematic cross-sectional view taken along line II-II in FIG. 2(A).
Figure 2:
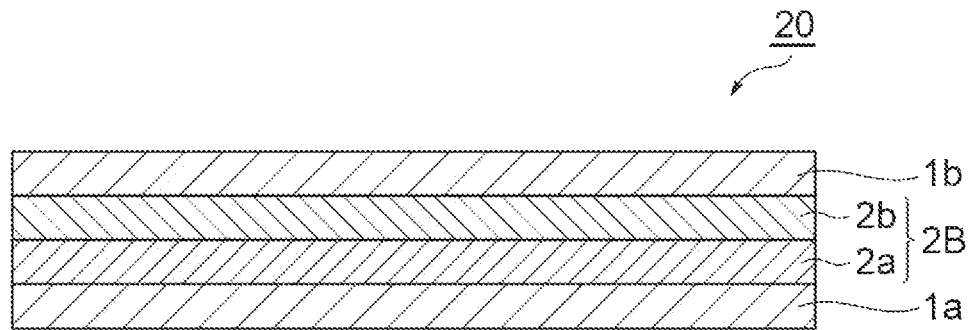

FIG. 2(A) is a top view illustrating an embodiment of a sheet for temporary fixing having two resin layers for temporary fixing, and FIG. 2(B) is a schematic cross-sectional view taken along line II-II in FIG. 2(A). A sheet for temporary fixing 20 illustrated in these drawings includes a support film 1a, a resin film for temporary fixing 2B including a first resin layer 2a and a second resin layer 2b, and a support film 1b in this order. The resin film for temporary fixing 2B including the first resin layer 2a and the second resin layer 2b satisfies the above-described condition relating to the shear viscosity. The first resin layer 2a and the second resin layer 2b may be configured by the same composition and may be configured by composition different from each other. In a case where the first resin layer 2a and the second resin layer 2b are configured by different compositions, it can be designed such that, for example, when the second resin layer 2b is the side that is in contact with the surface with unevenness of the semiconductor wafer, the second resin layer 2b has excellent step embeddability and excellent peelability with respect to the surface with a step (see FIG. 6(B)); meanwhile, the first resin layer 2a has excellent peelability with respect to a support (see a support 50 of FIG. 5(A)) to be bonded before processing.

The resin film for temporary fixing 2B can be formed by bonding a laminate, which is produced by mixing and kneading the aforementioned components in an organic solvent to prepare a varnish, coating this varnish on the support film 1a and drying the varnish, and a laminate, which is produced by coating the same varnish as described above or a separately prepared varnish on the support film 1b and drying the varnish. In a case where the first resin layer 2a and the second resin layer 2b are formed by the same varnish, there is an advantage that the amount of the organic solvent remaining is sufficiently and easily decreased even if a relatively thick resin film for temporary fixing is formed. The first resin layer 2a and the second resin layer 2b may be integrally formed so as to be a single-layer structure, and a two-layer structure may be maintained while an interface exists between two layers.

The 90° peeling strength (peeling rate: 300 mm/min) at 25° C. of the resin films for temporary fixing 2A and 2B with respect to the support (for example, a silicon mirror wafer) is preferably 5 to 200 N/m and more preferably 6 to 180 N/m. When the 90° peeling strength is within the above-described range, occurrence of the adhesive residue in the processed semiconductor wafer can be sufficiently suppressed, and the processed semiconductor wafer can be favorably peeled off from the support. That is, when the 90° peeling strength is 5 N/m or more, the electronic component and the support can be more firmly fixed to each other in a grinding processing step, and when the 90° peeling strength is 200 N/m or less, the adhesive residue between the resin film for temporary fixing and the support can be sufficiently decreased when the resin film for temporary fixing is peeled off from the support, and it is possible to further reduce possibility that the film remains on the support.

The 90° peeling strength can be measured as follows. A silicon mirror wafer (6 inches) having a thickness of 625 μm is placed on the stage of a vacuum laminator (manufactured by NPC Incorporated, LM-50X50-S), and the resin film for temporary fixing according to the present embodiment is installed thereon such that the second layer pasted to the silicon mirror wafer side. The product thus obtained is vacuum laminated by heating and pressurizing at a temperature of 120° C. and a pressure of 0.1 MPa for 2 minutes under the condition of 15 mbar, and thereby a sample for measurement is obtained. The sample for measurement thus obtained is cured and cut into a width of 10 mm. This sample is subjected to a peel test at a speed of 300 mm/min by a peel tester set to have a peeling angle of 90°, and the peeling strength at this time is regarded as the 90° peeling strength.

[Other Embodiments of Sheet for Temporary Fixing]

Figure 3:
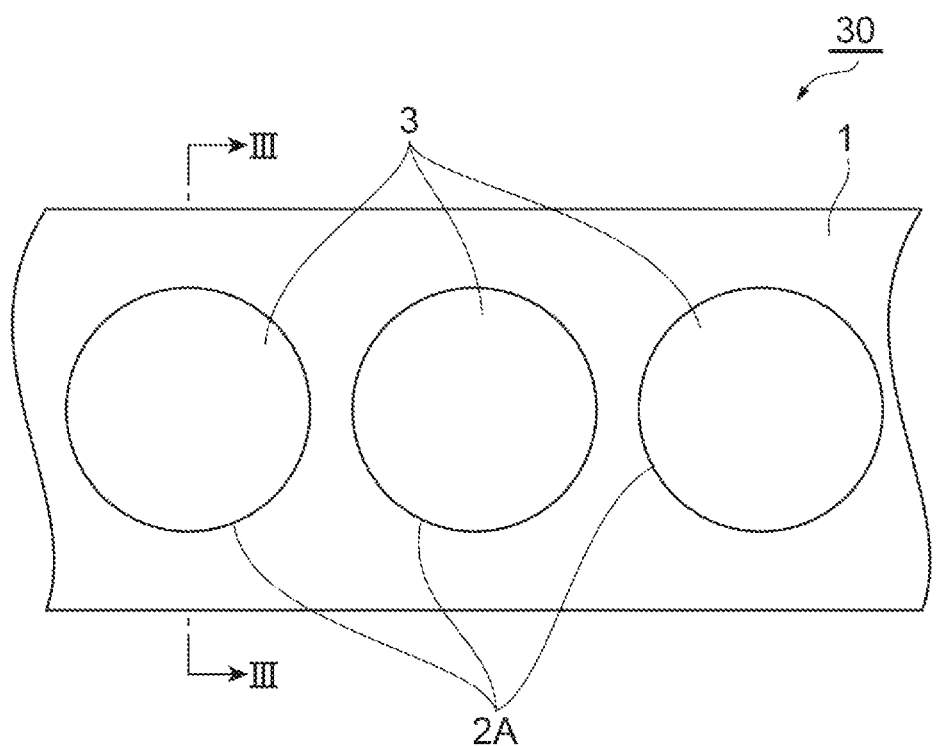
FIG. 3(A) is a top view illustrating another embodiment of a sheet for temporary fixing according to the present invention.
FIG. 3(B) is a schematic cross-sectional view taken along line III-III in FIG. 3(A).
Figure 3:
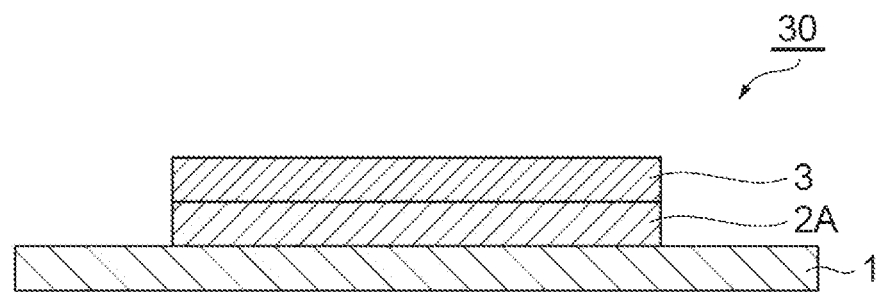

FIG. 3(A) is a top view illustrating another embodiment of a sheet for temporary fixing, and FIG. 3(B) is a schematic cross-sectional view taken along line III-III in FIG. 3(A). A sheet for temporary fixing 30 illustrated in FIG. 3(A) has the same configuration as that of the sheet for temporary fixing 10, except that the resin film for temporary fixing 2A and the protective film 3 are cut in advance according to the shape of the member to be temporarily fixed (for example, the semiconductor wafer).

Figure 4:
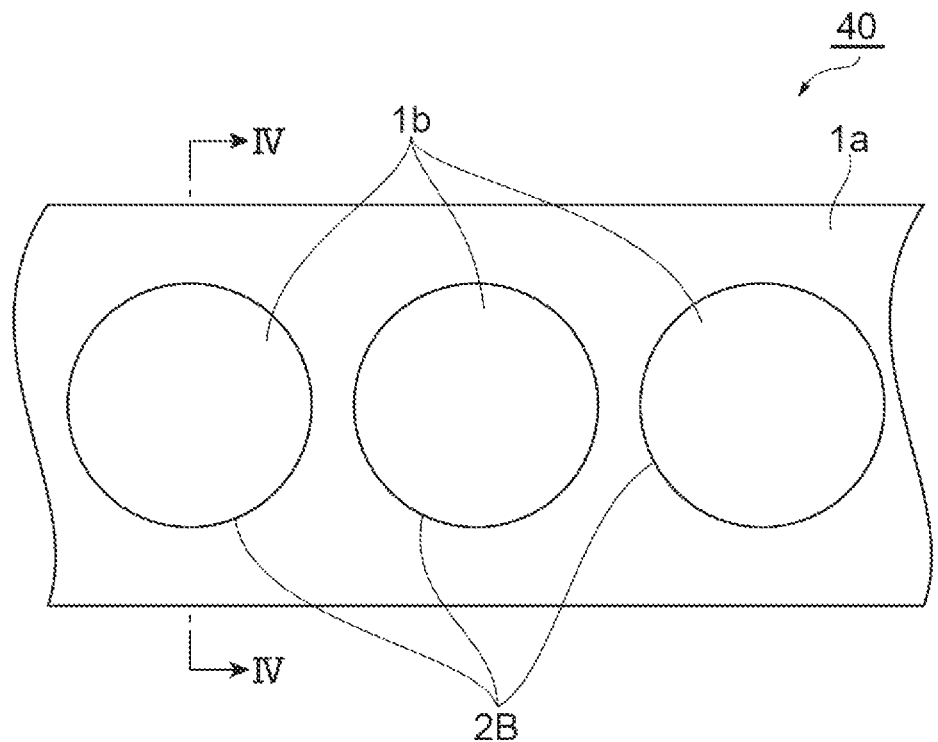
FIG. 4(A) is a top view illustrating still another embodiment of the sheet for temporary fixing according to the present invention.
FIG. 4(B) is a schematic cross-sectional view taken along line IV-IV in FIG. 4(A).
Figure 4:
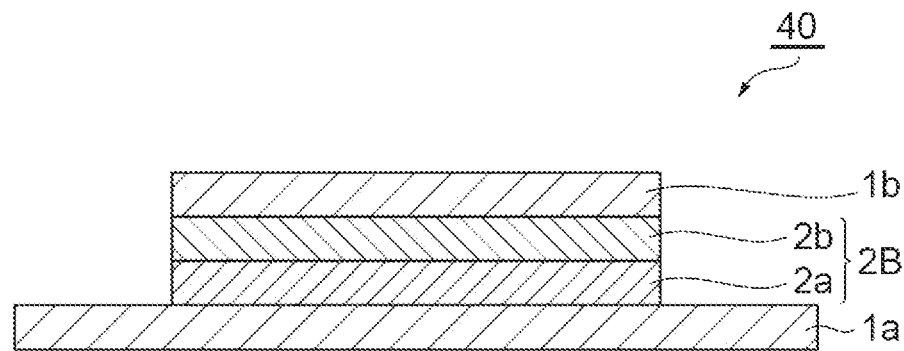

FIG. 4(A) is a top view illustrating still another embodiment of the sheet for temporary fixing, and FIG. 4(B) is a schematic cross-sectional view taken along line IV-IV in FIG. 4(A). A sheet for temporary fixing 40 illustrated in FIG. 4(A) has the same configuration as that of the sheet for temporary fixing 20, except that the support film 1b and the resin film for temporary fixing 2B are cut in advance according to the shape of the member to be temporarily fixed (for example, the semiconductor wafer). Note that, in the embodiments illustrated in FIG. 3(A) and FIG. 4(A), the embodiment in which the protective film 3, the support film 1b, and the resin films for temporary fixing 2A and 2B are cut in a circular shape has been exemplified, but a cut may be provided in these members according to the shape of the member to be temporarily fixed and the outer edge portion may be left.

[Processing Method of Semiconductor Wafer]

The processing method of a semiconductor wafer using the resin composition for temporary fixing broadly includes the following four steps:

(a) a temporary fixing step of temporarily fixing a semiconductor wafer to a support via a temporary fixing material composed of a resin composition for temporary fixing;

(b) a processing step of processing the semiconductor wafer temporarily fixed to the support;

(c) a separation step of separating the processed semiconductor wafer from the support and the temporary fixing material; and (d) a cleaning step of cleaning the semiconductor wafer in a case where there is a residue on the semiconductor wafer.

Figure 5:
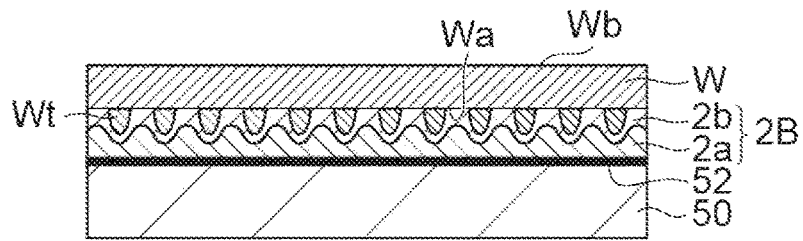
FIG. 5(A) to FIG. 5(C) are schematic cross-sectional views for describing an embodiment of a processing method of a semiconductor wafer.
FIG. 5(D) is a top view illustrating a back surface of the processed semiconductor wafer.
Figure 5:
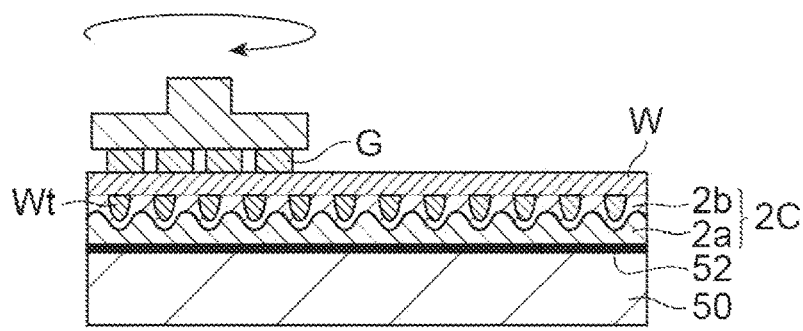
Figure 5:
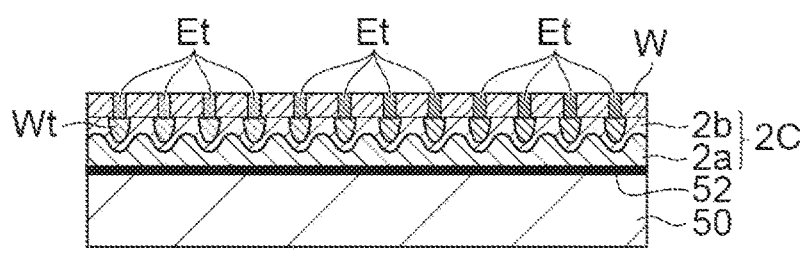
Figure 5:
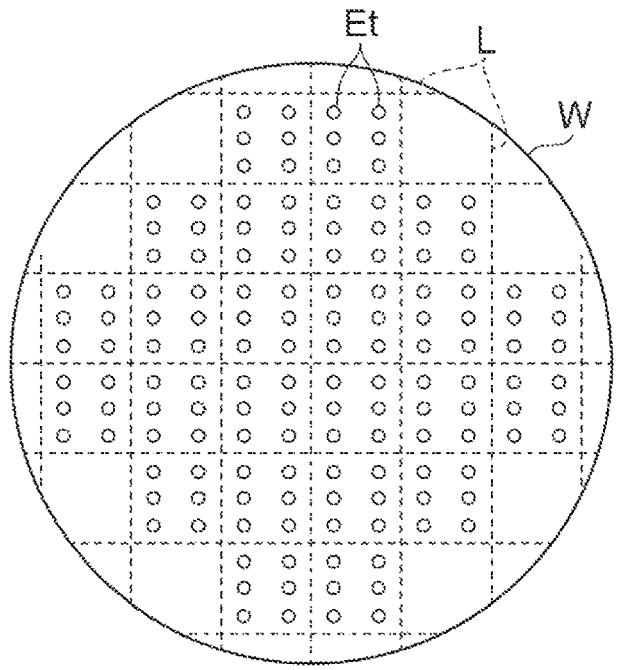

FIG. 5(A) to FIG. 5(C) are schematic cross-sectional views for describing an embodiment of a processing method of a semiconductor wafer, and FIG. 5(D) is a top view illustrating the processed semiconductor wafer. Note that, a case where the temporary fixing material (resin layer for temporary fixing) is the resin film for temporary fixing 2B having a two-layer configuration illustrated in FIG. 2(B) or FIG. 4(B) has been illustrated in FIG. 5(A) to FIG. 5(C), but the configuration of the temporary fixing material is not limited thereto.

<(a) Temporary Fixing Step>

The temporary fixing step is a step of temporarily fixing a semiconductor wafer W to a support 50 by interposing a temporary fixing material between the support 50 and the semiconductor wafer W (FIG. 5(A)). The thickness of the semiconductor wafer W is not particularly limited, and can be set to 300 to 800 μm. A circuit (not illustrated) is formed on a surface Wa of the semiconductor wafer W at the resin film for temporary fixing 2B and a plurality of connection terminals Wt are formed. The distance from the surface Wa of the semiconductor wafer W to a head top portion of the connection terminal Wt (the height of the connection terminal Wt) is, for example, 1 to 200 μm and may be 5 to 150 μm or 10 to 100 μm.

(a-1) Formation of Temporary Fixing Material on Support 50

As illustrated in FIG. 5(A), in the case of using the resin film for temporary fixing 2B having a two-layer configuration, the temporary fixing material can be formed on the support 50 by using a roll laminator, a vacuum laminator, and the like. Note that, a single-layer resin film for temporary fixing 2A may be used instead of the resin film for temporary fixing having a two-layer configuration. In the case of using a liquid resin composition for temporary fixing, the temporary fixing material is formed on the support 50 by a means such as spin coating, printing, and dispensing.

The material for the support 50 is not particularly limited, and a substrate such as a silicon wafer, a glass wafer, a quartz wafer, or an SUS plate can be used. The support 50 may be subjected to a peeling treatment, and a peeling layer 52 may be formed by subjecting the whole or a part of the surface of the support 50 (see FIG. 5(A)). A peeling agent to be used in the peeling treatment is not particularly limited, and for example, a surface modifying agent having a fluorine element, polyolefin-based wax and silicone oil, silicone oil containing a reactive group, and a silicone-modified alkyd resin are preferred since they are excellent in peelability.

(a-2) Pasting of Semiconductor Wafer W

The laminate having the support 50 and the temporary fixing material formed on the surface thereof is set on a wafer bonding device or a vacuum laminator. The semiconductor wafer W is pressed against the temporary fixing material so as to be pasted thereto (see FIG. 5(A)).

Examples of the wafer bonding device include a vacuum press EVG520IS (trade name) manufactured by EVG. In the case of using this device, the semiconductor wafer W and the support 50 may be temporarily fixed to each other via the temporary fixing material at an atmospheric pressure of 1 hPa or less, a pressing pressure of 1 MPa, a pressing temperature of 60° C. to 200° C., and a retention time of 100 seconds to 300 seconds.

Examples of the vacuum laminator include a vacuum laminator LM-50x50-S(trade name) manufactured by NPC Incorporated and a vacuum laminator V130 (trade name) manufactured by Nichigo Morton Co., Ltd. Regarding the pressing condition, the semiconductor wafer W and the support 50 may be temporarily fixed to each other via the temporary fixing material at an atmospheric pressure of 1 hPa or less, a pressing temperature of 40° C. to 180° C. (preferably 60° C. to 150° C.), a lamination pressure of 0.01 to 0.5 MPa (preferably 0.1 to 0.5 MPa), and a retention time of 1 second to 600 seconds (preferably 30 seconds to 300 seconds).

(a-3) Curing of Resin Film for Temporary Fixing

After the semiconductor wafer W is temporarily fixed to the support 50, the temporary fixing material is cured. The curing method is not particularly limited, and a method utilizing heat or radiation irradiation is mentioned. As the curing method, particularly, curing utilizing heat is preferred. In the case of curing utilizing heat, as the curing condition, curing is preferably performed at 100° C. to 200° C. for 10 to 300 minutes (more preferably 20 to 210 minutes). When the temperature is 100° C. or higher, the temporary fixing material is sufficiently cured and a problem is less likely to occur in the processing step, and when the temperature is 200° C. or lower, outgas is less likely to be generated during curing the temporary fixing material and the peeling-off of the temporary fixing material can be further suppressed. Furthermore, when the curing time is 10 minutes or longer, a problem is less likely to occur in the processing step, and when the curing time is 300 minutes or shorter, working efficiency is less likely to deteriorate. A resin film for temporary fixing 2C in FIG. 5(B) is a cured body of the resin film for temporary fixing 2B.

<(b) Processing Step>

The processing step includes grinding, electrode formation, metal wiring formation, protective film formation, and the like which are used at the wafer level. The grinding method is not particularly limited, and a known grinding method can be utilized. It is preferable to perform grinding while cooling the semiconductor wafer W and the grindstone (such as a diamond) by pouring water over them.

For example, as illustrated in FIG. 5(B), a back surface Wb of the semiconductor wafer W is ground by a grinder G to thin the thickness, for example, from about 700 μm to 100 μm or less. Examples of the device used in the grinding process include DGP-8761 (trade name) manufactured by DISCO Corporation, and the cutting conditions can be arbitrarily selected depending on the desired thickness and grinding state of the semiconductor wafer W.

Specific examples of other steps include known processes such as metal sputtering for the formation of an electrode and the like, wet etching to etch a metal sputtering layer, formation of a pattern by coating, exposure, and development of a resist for masking of the metal wiring formation, peeling of the resist, dry etching, formation of the metal plating, silicon etching for the TSV formation, and formation of an oxide film on the silicon surface.

FIG. 5(C) illustrates an example in which the back surface side of the thinned semiconductor wafer W is subjected to the processing such as dry ion etching or the Bosch process to form a through hole, and then subjected to a treatment such as copper plating, thereby forming a through electrode Et. FIG. 5(D) is a top view illustrating the back surface Wb side of the processed semiconductor wafer W. Note that, as described later, the semiconductor wafer W is subjected to a dicing step of cutting the semiconductor wafer W along a dicing line L indicated by the broken line in FIG. 5(D) and is diced into individual pieces of semiconductor elements.

<(c) Separation Step>

FIG. 6(A) to FIG. 6(D) are schematic cross-sectional view illustrating the subsequent steps from the state illustrated in FIG. 5(C). The separation step includes a first peeling step of peeling off the semiconductor wafer W along with the resin film for temporary fixing from the support 50 (see FIG. 6(A)) and a second peeling step of peeling off the temporary fixing material from the semiconductor wafer W (see FIG. 6(B)). Note that, the semiconductor wafer W may be peeled off from the resin film for temporary fixing without performing the first peeling step. Examples of the peeling method include a method in which one of the semiconductor wafer W and the support 50 is horizontally fixed in advance and the other is lifted up from the horizontal direction with a certain angle, and a method in which a protective film is bonded on a grinding surface of an electronic component and the electronic component and the protective film are peeled off from the support 50 by a peeling method.

Figure 6:
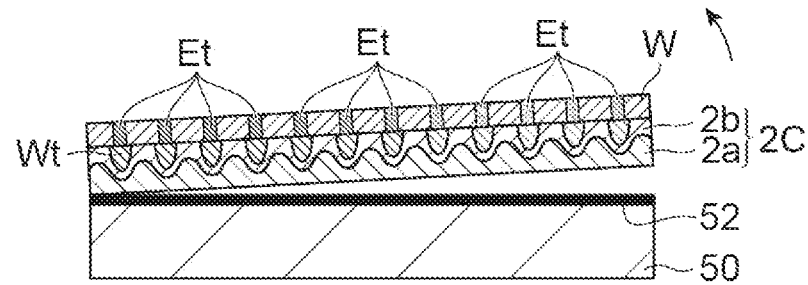
FIG. 6(A) to FIG. 6(D) are schematic cross-sectional views for describing an embodiment of the processing method of a semiconductor wafer.
Figure 6:
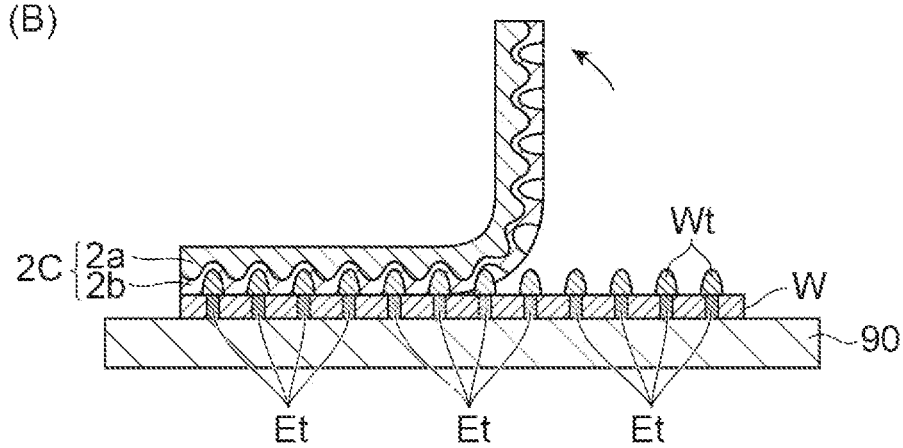
Figure 6:
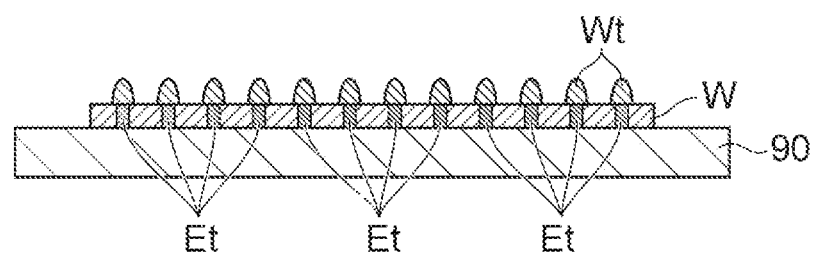
Figure 6:
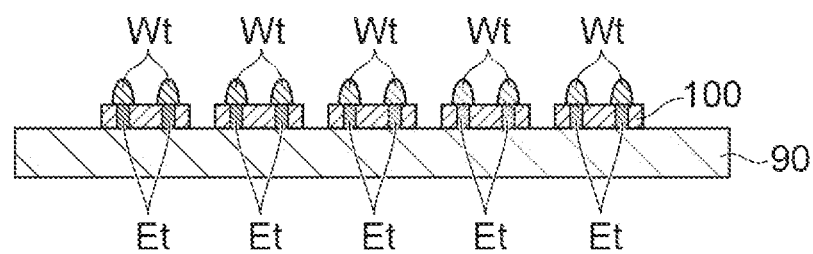

In the second peeling step, for example, as illustrated in FIG. 6(B), the semiconductor wafer W and the temporary fixing material which are peeled off are transferred onto a dicing tape 90, the semiconductor wafer W is horizontally fixed in advance, the end of the temporary fixing material is lifted up from the horizontal direction with a certain angle, and thereby the semiconductor wafer W from which the temporary fixing material is peeled off can be obtained (see FIG. 6(C)). The temporary fixing material is formed using the resin film for temporary fixing according to the present embodiment, and thereby the processed semiconductor wafer W in which the residue such as an adhesive residue is sufficiently reduced can be easily obtained. These peeling methods are usually performed at room temperature, and may be performed at a temperature of about 40° C. to 100° C. at which the electronic component is not damaged. For example, Debonder (manufactured by SÜSS MICROTEC SE, DB12T), De-Bonding device (manufactured by EVG, EVG805EZD), or the like is used at the time of mechanical disassembling.

<(d) Cleaning Step>

A part of the temporary fixing material is likely to remain on the circuit forming surface (surface Wa) of the semiconductor wafer W. In a case where the temporary fixing material partially remains on the circuit forming surface of the semiconductor wafer W, a cleaning step for removing this can be provided. Removal of the temporary fixing material can be performed, for example, by cleaning the semiconductor wafer W.

The cleaning liquid is not particularly limited as long as it is a cleaning liquid that can remove the partially remaining temporary fixing materials. Examples of such a cleaning liquid include the above-described organic solvent that can be used in dilution of the resin composition for temporary fixing. These organic solvents may be used alone and may be used in combination of two or more kinds thereof.

Furthermore, in a case where it is difficult to remove the remaining temporary fixing material, a base and an acid may be added to the organic solvent. As an example of the base, it is possible to use an amine such as ethanolamine, diethanolamine, triethanolamine, triethylamine, or ammonia; and an ammonium salt such as tetramethylammonium hydroxide. As the acid, it is possible to use an organic acid such as acetic acid, oxalic acid, benzenesulfonic acid, or dodecylbenzenesulfonic acid. The addition amount is preferably 0.01 to 10% by mass as a concentration in the cleaning liquid. Furthermore, an existing surfactant may be added to the cleaning liquid in order to improve the removability of the remained substance.

The cleaning method is not particularly limited, and examples thereof include a method in which cleaning is performed by a paddle using the above-described cleaning liquid, a cleaning method by spraying with a spray, and a method in which the semiconductor wafer is immersed in the cleaning liquid bath. The temperature is suitably 10° C. to 80° C. and preferably 15° C. to 65° C., and the thin type semiconductor wafer W is obtained by finally performing water washing or alcohol cleaning and a drying treatment.

Note that, as mentioned above, with the resin film composition for temporary fixing according to the present embodiment, it is possible to sufficiently reduce the residue such as an adhesive residue and thus the cleaning step can be omitted.

The semiconductor wafer W in which the through electrode Et is formed is further diced into individual pieces of semiconductor elements by dicing along a dicing line L (see FIG. 6(D)). Note that, a plurality of semiconductor elements 100 illustrated in FIG. 6(D) are separated apart from each other by expansion of the dicing tape 90.

Figure 7:
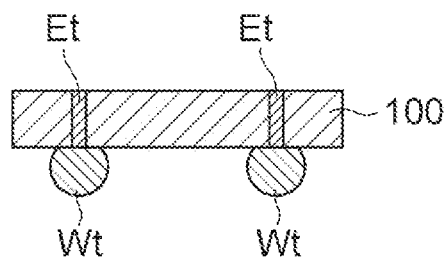
FIG. 7(A) is a cross-sectional view schematically illustrating an example of a semiconductor element manufactured through a processing method according to the present invention.
FIG. 7(B) is a cross-sectional view schematically illustrating an example of an electronic apparatus in which a plurality of semiconductor elements are stacked.
Figure 7:
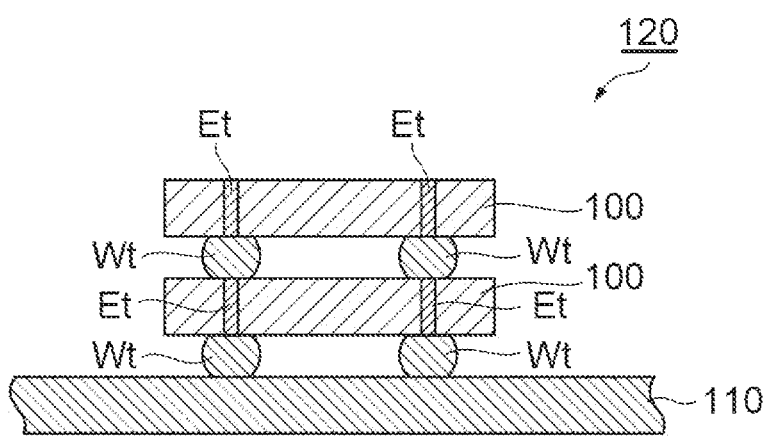

FIG. 7(A) is a cross-sectional view schematically illustrating the semiconductor element 100 manufactured through the above-described steps. FIG. 7(B) is a cross-sectional view schematically illustrating an example of an electronic apparatus in which a plurality of the semiconductor elements 100 are stacked. An electronic apparatus 120 can be obtained by stacking a plurality of the semiconductor elements 100 on a wiring board 110 and further disposing the semiconductor element 100 on the semiconductor element 100 to be electrically connected.

Hereinbefore, embodiments of the present invention have been described, but the present invention is not necessarily limited to the aforementioned embodiments and may be adequately modified within a scope not departing from the gist thereof. For example, the resin composition for temporary fixing, the resin film for temporary fixing, the sheet for temporary fixing, and the method for manufacturing a semiconductor device according to the present invention are not limited to processing of a semiconductor wafer and can be applied to processing of various electronic components and used in a method for manufacturing an electronic apparatus.

EXAMPLES

Hereinafter, the present invention will be described more specifically by way of Examples and Comparative Example; however, the present invention is not intended to be limited to the following Examples.

[Synthesis of Acrylic Rubber K-1]

In a 500 cc separable flask equipped with a stirrer, a thermometer, a nitrogen purging device (nitrogen inflow tube), and a reflux condenser with a water receptor, the following components were mixed.

Deionized water 200 g
Butyl acrylate 60 g
Methyl methacrylate 10 g
2-Hydroxyethyl methacrylate 10 g
Glycidyl methacrylate 20 g
1.8% Polyvinyl alcohol aqueous solution 1.94 g
Lauryl peroxide 0.2 g
n-Octylmercaptan 0.08 g Subsequently, an $N_2$ gas was blown into the flask over 60 minutes to purge air in the system, the temperature in the system was then increased to 65° C., and polymerization was performed for 5 hours. Further, the temperature in the system was increased to 90° C. and stirring was continued for 2 hours, thereby completing the polymerization. The transparent beads obtained by the polymerization reaction were separated by filtration, washed with deionized water, and then dried by a vacuum dryer at 50° C. for 6 hours, thereby obtaining acrylic rubber K-1. When the acrylic rubber K-1 was measured by GPC, the weight average molecular weight of the acrylic rubber K-1 was 300000 in terms of polystyrene. The Tg of the acrylic rubber K-1 was −20° C.

[Synthesis of Acrylic Rubber K-2]

In a 500 cc separable flask equipped with a stirrer, a thermometer, a nitrogen purging device (nitrogen inflow tube), and a reflux condenser with a water receptor, the following components were mixed.

Deionized water 200 g
Butyl acrylate 70 g
Methyl methacrylate 10 g
2-Hydroxyethyl methacrylate 10 g
Glycidyl methacrylate 10 g
1.8% Polyvinyl alcohol aqueous solution 1.94 g
Lauryl peroxide 0.2 g
n-Octylmercaptan 0.06 g Subsequently, an $N_2$ gas was blown into the flask over 60 minutes to purge air in the system, the temperature in the system was then increased to 65° C., and polymerization was performed for 5 hours. Further, the temperature in the system was increased to 90° C. and stirring was continued for 2 hours, thereby completing the polymerization. The transparent beads obtained by the polymerization reaction were separated by filtration, washed with deionized water, and then dried by a vacuum dryer at 50° C. for 6 hours, thereby obtaining acrylic rubber K-2. When the acrylic rubber K-2 was measured by GPC, the weight average molecular weight of the acrylic rubber K-2 was 400000 in terms of polystyrene. The Tg of the acrylic rubber K-2 was −28° C.

Examples 1 to 5 and Comparative Examples 1 to 8

[Preparation of Resin Film for Temporary Fixing]

Varnishes according to Examples and Comparative Examples were prepared, respectively, using compositions (parts by mass) shown in Tables 1 to 3. Each of the varnish thus prepared was coated on a release-processed surface of a release-processed polyethylene terephthalate film (manufactured by Teijin Film Solutions Limited, A31, thickness: 38 μm) and heated and dried at 90° C. for 5 minutes at 140° C. for 5 minutes, and thereby a first resin layer was formed. A second resin layer was formed using the same varnish, and a resin film for temporary fixing was obtained by the first resin layer and the second resin layer. Thereafter, a protective film was pasted onto the resin film for temporary fixing, and a resin film for temporary fixing with the protective film and the support film was obtained.

TABLE 1

| Composition (parts by mass) | | Ex.1 | Ex.2 | Ex.3 | Ex.4 | Ex.5 |
|---|---|---|---|---|---|---|
| Thermoplastic resin | Acrylic rubber K-1 | 100 | 100 | — | — | — |
| | Acrylic rubber K-2 | — | — | 100 | 100 | 100 |
| | HTR-860P-3CSP | — | — | — | — | — |
| Curable component | YDCN-700-10 | 10 | 20 | 20 | 20 | 20 |
| | EXA-830CRP | 5 | 10 | 10 | 10 | 10 |
| | XLC-LL | 10 | 20 | 20 | 20 | 20 |
| Silicone compound | SH3773M | 0.1 | 0.1 | 0.1 | 0.1 | 0.1 |
| | TA31-209E | — | — | — | — | — |
| Curing accelerator | 2PZ-CN | — | — | 0.05 | — | — |
| | 2PHZ-PW | 0.2 | 0.2 | — | 0.5 | 1 |
| Filler | SC2050-HLG | — | — | — | — | — |
| Non-volatile component (% by mass) (solvent: cyclohexanone) | | 25 | 25 | 25 | 25 | 25 |

TABLE 2

| Composition (parts by mass) | | Comp. Ex.1 | Comp. Ex.2 | Comp. Ex.3 | Comp. Ex.4 |
|---|---|---|---|---|---|
| Thermoplastic resin | Acrylic rubber K-1 | — | — | 100 | 100 |
| | Acrylic rubber K-2 | — | — | — | — |
| | HTR-860P-3CSP | 100 | 100 | — | — |
| Curable component | YDCN-700-10 | 20 | — | 20 | 10 |
| | EXA-830CRP | — | — | 10 | 5 |
| | HE100-30 | — | 60 | 20 | 10 |
| Silicone compound | SH3773M | 20 | 30 | 0.1 | 0.1 |
| | TA31-209E | 50 | 30 | — | — |
| Curing accelerator | 2PZ-CN | 1.5 | 1 | 1 | 1 |
| | 2PHZ-PW | — | — | 1 | — |
| Filler | SC2050-HLG | 10 | — | — | — |
| Non-volatile component (% by mass) (solvent: cyclohexanone) | | 25 | 25 | 25 | 25 |

TABLE 3

| Composition (parts by mass) | | Comp. Ex.5 | Comp. Ex. 6 | Comp. Ex.7 | Comp. Ex.8 |
|---|---|---|---|---|---|
| Thermoplastic resin | Acrylic rubber K-1 | 100 | 100 | 100 | — |
| | Acrylic rubber K-2 | — | — | — | 100 |
| | HTR-860P-3CSP | — | — | — | — |
| Curable component | YDCN-700-10 | 20 | 20 | 20 | 20 |
| | EXA-830CRP | 10 | 10 | 10 | 10 |
| | HE100-30 | 20 | 20 | 20 | 20 |

TABLE 3-continued

| Composition (parts by mass) | | Comp. Ex.5 | Comp. Ex. 6 | Comp. Ex.7 | Comp. Ex.8 |
|---|---|---|---|---|---|
| Silicone compound | SH3773M | 0.1 | 0.1 | 0.1 | 0.1 |
|  | TA31-209E | — | — | — | — |
| Curing accelerator | 2PZ-CN | 0.2 | 0.02 | — | 0.2 |
|  | 2PHZ-PW | — | — | — | — |
| Filler | SC2050-HLG | — | — | — | — |
| Non-volatile component (% by mass) (solvent: cyclohexanone) | | 25 | 25 | 25 | 25 |

The details of respective components described in Tables 1 to 3 are as follows.

Acrylic rubber K-1: weight average molecular weight by GPC of 300000, 20% by mass of glycidyl methacrylate, acrylic rubber having Tg of −20° C.

Acrylic rubber K-2: weight average molecular weight by GPC of 400000, 10% by mass of glycidyl methacrylate, acrylic rubber having Tg of −28° C.

HTR-860P-3CSP: weight average molecular weight by GPC of 800000, 3% by mass of glycidyl methacrylate, acrylic rubber having Tg of 12° C. (manufactured by Nagase ChemteX Corporation)

YDCN-700-10: Cresol novolak type polyfunctional epoxy resin (manufactured by Nippon Steel & Sumikin Chemical Co., Ltd.)

EXA-830CRP: Bisphenol F type epoxy resin (manufactured by DIC Corporation)

HE100-30: Phenol aralkyl resin (manufactured by AIR WATER INC.)

SH3773M: polyether-modified silicone compound (manufactured by Dow Corning Toray Co., Ltd.)

TA31-209E: Silicone-modified alkyd resin (manufactured by Hitachi Chemical Co., Ltd.)

2PZ-CN: Imidazole-based curing accelerator (manufactured by SHIKOKU CHEMICALS CORPORATION)

2PHZ-PW: Imidazole-based curing accelerator (manufactured by SHIKOKU CHEMICALS CORPORATION)

SC2050-HLG: Epoxysilane surface-treated silica filler (manufactured by Admatechs Company Limited)

Regarding the prepared resin films for temporary fixing of Examples and Comparative Examples, the shear viscosity at 120° C., the step embeddability, the heat resistance evaluation at 250° C., the elastic modulus after curing (storage elastic modulus at 25° C.), the 90° peeling strength of the resin film for temporary fixing with respect to the support, and the processability evaluation were evaluated according to the following methods. The evaluation results before (no time elapsed) and after (time elapsed) the resin composition was left to stand for 7 days in an atmosphere of 25° C. are shown in Tables 4 to 6.

[Shear Viscosity Measurement]

The shear viscosity in the resin film for temporary fixing was evaluated by the following method. Eight films adjusted to have a thickness of 30 μm were laminated at 80° C. to have a thickness of 240 μm, and then the shear viscosity was measured using a rotating type viscoelasticity measuring apparatus (manufactured by TA Instruments, ARES). The measurement was performed at a frequency of 1 Hz by using "parall plate" as a measurement method, a circular jig having a diameter of 8 mm as a measurement jig, "Dynamic temperature ramp" as a measurement mode, and the viscosity when the temperature reached 120° C. was measured while applying 5% strain and increasing the temperature from 35° C. to 200° C. at a temperature increase rate of 20° C./min.

[Step Embeddability]

The step embeddability of the resin film for temporary fixing was evaluated by the following method. A resin film for temporary fixing was bonded to the surface of a silicon mirror wafer (6 inches) having a thickness of 625 μm at 80° C. by roll lamination to obtain a wafer with the resin film for temporary fixing. Next, grooves having a width of 40 μm and a depth of 40 μm were prepared on the surface of a silicon mirror wafer (6 inches) having a thickness of 625 μm at an interval of 100 μm by blade dicing. The silicon mirror wafer with a step which was prepared in this manner was placed on the stage of a vacuum laminator (manufactured by NPC Incorporated, LM-50X50-S) such that the step was to be the top surface, and the wafer with the resin film for temporary fixing which was prepared above was installed thereon so as to be pasted to the silicon mirror wafer with a step such that the surface of the resin film for temporary fixing faced downward. The product thus obtained was vacuum laminated by heating and pressurizing at a temperature of 120° C. and a pressure of 0.1 MPa for 2 minutes under the condition of 15 mbar. Thereafter, the state of the resin film for temporary fixing was checked using a scanning acoustic microscope (SAM, manufactured by Insight k.k., Insight-300). The evaluation criteria of embeddability are as follows.

A: The proportion of voids is less than 5%.
B: The proportion of voids is 5% or more.

[Heat Resistance Evaluation at 250° C.]

The heat resistance at 250° C. of the resin film for temporary fixing was evaluated by the following method. A silicon mirror wafer (6 inches) having a thickness of 625 μm was diced into individual pieces having 25 mm square by blade dicing. The resin film for temporary fixing was roll laminated on the surface of the silicon mirror wafer diced into individual pieces at 80° C. Next, a glass slide having a thickness of 0.1 to 0.2 mm and a size of about 18 mm square was roll laminated on the resin film for temporary fixing at 80° C., thereby preparing a laminate sample in which the resin film for temporary fixing was sandwiched between the silicon wafer and the glass slide. The resin film for temporary fixing was cured by heating the sample thus obtained at 130° C. for 30 minutes and subsequently at 170° C. for 2 hours, and then heated at 200° C. for 30 minutes. Further, the sample was then heated at 250° C. for 30 minutes. The sample obtained in this manner was observed through the glass slide surface, the image was analyzed with software such as Photoshop (registered trademark), and the heat resistance at 250° C. was evaluated by the proportion of voids occupying the entire area of the resin film for temporary fixing. The evaluation criteria are as follows.

A: The proportion of voids is less than 5%.
B: The proportion of voids is 5% or more.

[Storage Elastic Modulus at 25° C.]

The storage elastic modulus after curing of the resin film for temporary fixing was evaluated by the following method. Eight films adjusted to have a thickness of 30 μm were laminated at 80° C. to have a thickness of 240 μm, and then heated at 130° C. for 30 minutes and subsequently at 170° C. for 2 hours to cure the resin film for temporary fixing, and then heated at 200° C. for 30 minutes. Thereafter, the resin film was cut in a thickness direction into a size of a width of 4 mm and a length of 33 mm. The cut film was set on a dynamic viscoelasticity apparatus (product name: Rheogel-E4000, manufactured by UBM), a tensile load was applied to the film, and the storage elastic modulus at 25° C. was measured at a frequency of 10 Hz with the temperature being increased at a temperature increase rate of 3° C./min.

[90° Peeling Strength]

The 90° peeling strength between the silicon mirror wafer and the resin film for temporary fixing was evaluated by the following method. A silicon mirror wafer (6 inches) having a thickness of 625 μm was placed on the stage of a vacuum laminator (manufactured by NPC Incorporated, LM-50X50-S), the resin film for temporary fixing was installed thereon so as to be pasted to the silicon mirror wafer side, and vacuum laminated by heating and pressurizing at a temperature of 120° C. and a pressure of 0.1 MPa for 2 minutes under the condition of 15 mbar. The sample thus obtained was cured by heating at 130° C. for 30 minutes and subsequently at 170° C. for 2 hours, this product was further heated at 200° C. for 30 minutes, and then cut into a width of 10 mm, and thereby a film for measurement was obtained. The film for measurement was subjected to a peel test at a speed of 300 mm/min by a peel tester set to have a peeling angle of 90°, and the peeling strength at this time was regarded as the 90° peeling strength.

[Processability Evaluation]

The peelability of the resin film for temporary fixing by a debonding device was evaluated by the following method. The resin film for temporary fixing was pasted to a silicon mirror wafer as the support at 80° C. by roll lamination to obtain a support with the resin film for temporary fixing. Next, grooves having a width of 40 μm and a depth of 40 μm were prepared on the surface of a silicon mirror wafer (8 inches) having a thickness of 725 μm at an interval of 100 μm by blade dicing, and a silicon wafer with a step on the surface was prepared. The resin film for temporary fixing of the support with the resin film for temporary fixing was bonded to the step side of this silicon wafer so as to be in contact with the step side and heated and pressurized at a temperature of 120° C. and a pressure of 0.1 MPa for 2 minutes under the condition of 5 mbar using a vacuum bonding device (manufactured by Ayumi INDUSTRY CO., LTD., VE07-14), thereby obtaining a laminate. The laminate obtained in this way was heated at 130° C. for 30 minutes and subsequently at 170° C. for 1 hour, and thereby the resin film for temporary fixing was cured. Thereafter, this resin film for temporary fixing was heated at 200° C. for 30 minutes, tweezers having sharp leading ends were inserted between the step side of the silicon wafer and the resin film for temporary fixing, and the tweezers were moved along the outer edge. A case where the silicon wafer and the support could be peeled off without breaking was rated as "A", and a case where peeling-off could not be performed or damages were observed was rated as "B".

TABLE 4

| Item | | Ex.1 | Ex.2 | Ex.3 | Ex.4 | Ex.5 |
|---|---|---|---|---|---|---|
| No time elapsed | Shear viscosity (Pa · s) at 120° C. | 1200 | 900 | 1200 | 1200 | 1200 |
| | Step embeddability | A | A | A | A | A |
| | Heat resistance at 250° C. | A | A | A | A | A |
| | Storage elastic modulus (MPa) at 25° C. | 450 | 600 | 260 | 390 | 440 |
| | 90° peeling strength (N/m) | 300 | 300 | 50 | 60 | 50 |
| | Processability evaluation | A | A | A | A | A |
| Time elapsed | Shear viscosity (Pa · s) at 120° C. | 1300 | 900 | 1300 | 1200 | 1300 |
| | Step embeddability | A | A | A | A | A |
| | Heat resistance at 250° C. | A | A | A | A | A |
| | Storage elastic modulus (MPa) at 25° C. | 450 | 610 | 270 | 380 | 450 |
| | 90° peeling strength (N/m) | 300 | 300 | 50 | 60 | 50 |
| | Processability evaluation | A | A | A | A | A |
| Rate (%) of change in shear viscosity | | 8.3 | 0.0 | 8.3 | 0.0 | 8.3 |

TABLE 5

| Item | | Comp. Ex.1 | Comp. Ex.2 | Comp. Ex.3 | Comp. Ex.4 |
|---|---|---|---|---|---|
| No time elapsed | Shear viscosity (Pa · s) at 120° C. | 18000 | 10000 | 1600 | 1800 |
| | Step embeddability | B | B | A | A |
| | Heat resistance at 250° C. | B | B | A | A |
| | Storage elastic modulus (MPa) at 25° C. | 810 | 1000 | 500 | 450 |
| | 90° peeling strength (N/m) | 45 | 30 | 300 | 300 |
| | Processability evaluation | B | B | A | A |
| Time elapsed | Shear viscosity (Pa · s) at 120° C. | 21000 | 14000 | 9100 | 7200 |
| | Step embeddability | B | B | B | B |
| | Heat resistance at 250° C. | — | — | — | — |
| | Storage elastic modulus (MPa) at 25° C. | — | — | — | — |
| | 90° peeling strength (N/m) | — | — | — | — |
| | Processability evaluation | B | B | B | B |
| Rate (%) of change in shear viscosity | | 16.7 | 40.0 | 469 | 300 |

TABLE 6

| Item | | Comp. Ex.5 | Comp. Ex.6 | Comp. Ex.7 | Comp. Ex.8 |
|---|---|---|---|---|---|
| No time elapsed | Shear viscosity (Pa · s) at 120° C. | 1600 | 1000 | 1400 | 1700 |
| | Step embeddability | A | A | A | A |
| | Heat resistance at 250° C. | A | B | A | A |
| | Storage elastic modulus (MPa) at 25°° C. | 435 | 310 | 460 | 160 |
| | 90° peeling strength (N/m) | 300 | 300 | 300 | 60 |
| | Processability evaluation | A | B | A | A |
| Time elapsed | Shear viscosity (Pa · s) at 120° C. | 5600 | — | 2400 | 3100 |
| | Step embeddability | B | — | B | B |
| | Heat resistance at 250° C. | — | — | — | — |
| | Storage elastic modulus (MPa) at 25° C. | — | — | — | — |
| | 90° peeling strength (N/m) | — | — | — | — |
| | Processability evaluation | B | — | B | B |
| Rate (%) of change in shear viscosity | | 250 | — | 71.4 | 82.4 |

INDUSTRIAL APPLICABILITY

According to the present invention, it is possible to provide a resin composition for temporary fixing with which an electronic component can be favorably processed. Furthermore, according to the present invention, it is possible to provide a resin film for temporary fixing and a sheet for temporary fixing which use the above-described resin composition for temporary fixing, and a method for manufacturing a semiconductor device.

REFERENCE SIGNS LIST 1, 1a, 1b: support film, 2A, 2B: temporary fixing material (resin composition for temporary fixing, resin layer for temporary fixing, resin film for temporary fixing), 2C: temporary fixing material (cured body of resin composition for temporary fixing), 2a: first resin layer (resin layer for temporary fixing), 2b: second resin layer (resin layer for temporary fixing), 3: protective film, 10, 20, 30, 40: sheet for temporary fixing, 50: support, 100: semiconductor element, 120: semiconductor device, Et: through electrode, W: semiconductor wafer, Wt: connection terminal.

The invention claimed is:

1. A resin film comprising two layers that are composed of a resin composition for temporary fixing, the resin composition comprising:
   (A) a thermoplastic resin;
   (B) a thermosetting resin; and
   (C) a silicone compound,
   wherein the resin composition has a shear viscosity of 4000 Pa·s or less at 120° C. and a rate of change in the shear viscosity being within 30% as determined before and after the resin composition is left to stand for 7 days at an ambient temperature of 25° C.

2. The resin film according to claim 1, wherein a content of the thermosetting resin (B) is 10 to 500 parts by mass with respect to 100 parts by mass of the thermoplastic resin (A).

3. The resin film according to claim 1, wherein the thermosetting resin (B) comprises at least one selected from the group of an epoxy resin and a phenolic resin.

4. The resin film according to claim 1, further comprising (D) a curing accelerator.

5. The resin film according to claim 1, wherein the thermoplastic resin (A) is a reactive group-containing (meth)acrylic copolymer containing a (meth)acrylic monomer having a reactive group as a copolymerization component.

6. The resin film according to claim 5, wherein the reactive group-containing (meth)acrylic copolymer is an epoxy group-containing (meth)acrylic copolymer containing 1.0 to 10% by mass of a (meth)acrylic monomer having an epoxy group based on a total amount of the copolymerization component.

7. The resin film according to claim 1, wherein the silicone compound (C) is an organic group-modified silicone.

8. The resin film according to claim 1, wherein one layer composed of the resin composition for temporary fixing and another layer composed of the resin composition for temporary fixing are in direct contact with each other.

9. A sheet for temporary fixing, comprising:
   the resin film according to claim 1; and
   a support film provided on at least one surface of the resin film.

10. A resin composition for temporary fixing, comprising:
    (A) a thermoplastic resin;
    (B) a thermosetting resin; and
    (C) a silicone compound,
    wherein the resin composition has a shear viscosity of 4000 Pa·s or less at 120° C. and a rate of change in the shear viscosity being within 30% as determined before and after the resin composition is left to stand for 7 days at an ambient temperature of 25° C.,
    wherein the thermoplastic resin (A) is a reactive group-containing (meth)acrylic copolymer containing a (meth)acrylic monomer having a reactive group as a copolymerization component, and
    wherein the reactive group-containing (meth)acrylic copolymer is an epoxy group-containing (meth)acrylic copolymer containing 1.0 to 10% by mass of a (meth)acrylic monomer having an epoxy group based on a total amount of the copolymerization component.

11. A method for manufacturing a semiconductor device, the method comprising:
    temporarily fixing a semiconductor wafer to a support via a temporary fixing material composed of the resin composition according to claim 10;
    processing the semiconductor wafer temporarily fixed to the support; and
    separating the processed semiconductor wafer from the temporary fixing material.

12. The resin composition according to claim 10, wherein the silicone compound (C) is an organic group-modified silicone.

13. The resin composition according to claim 10, wherein a content of the thermosetting resin (B) is 10 to 500 parts by mass with respect to 100 parts by mass of the thermoplastic resin (A).

14. The resin composition according to claim 10, wherein a content of the silicone compound (C) is 0.01 to 100 parts by mass with respect to 100 parts by mass of the thermoplastic resin (A).

15. A resin film for temporary fixing, comprising at least one layer composed of the resin composition according to claim 10.

16. The resin film according to claim 15, wherein the resin film has a 90° peeling strength of 5 N/m to 200 N/m with respect to a silicon mirror wafer at 25° C. and at a peeling rate of 300 mm/min.

17. The resin film according to claim 15, wherein one layer composed of the resin composition for temporary fixing and another layer composed of the resin composition for temporary fixing are in direct contact with each other.

18. A sheet for temporary fixing, comprising:
    the resin film according to claim 15; and
    a support film provided on at least one surface of the resin film.

19. A method for manufacturing a semiconductor device, the method comprising:
    temporarily fixing a semiconductor wafer to a support via a temporary fixing material composed of the resin composition according to claim 10;
    processing the semiconductor wafer temporarily fixed to the support; and
    separating the processed semiconductor wafer from the temporary fixing material.

20. The method according to claim 19, further comprising:
    dicing the processed semiconductor wafer to obtain semiconductor elements; and
    disposing and electrically connecting the semiconductor elements on a wiring board to obtain the semiconductor device.

* * * * *